(12) United States Patent
Ventzek et al.

(10) Patent No.: US 9,530,621 B2
(45) Date of Patent: Dec. 27, 2016

(54) INTEGRATED INDUCTION COIL AND MICROWAVE ANTENNA AS AN ALL-PLANAR SOURCE

(71) Applicant: Tokyo Electron Limited, Minato-ku, Tokyo (JP)

(72) Inventors: Peter L. G. Ventzek, Austin, TX (US); Lee Chen, Cedar Creek, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 8 days.

(21) Appl. No.: 14/288,572

(22) Filed: May 28, 2014

(65) Prior Publication Data

US 2015/0348756 A1    Dec. 3, 2015

(51) Int. Cl.
| | | |
|---|---|---|
| C23C 16/00 | (2006.01) | |
| C23F 1/00 | (2006.01) | |
| H01L 21/306 | (2006.01) | |
| H01J 37/32 | (2006.01) | |

(52) U.S. Cl.
CPC ...... *H01J 37/32229* (2013.01); *H01J 37/3211* (2013.01); *H01J 37/3222* (2013.01); *H01J 37/32192* (2013.01)

(58) Field of Classification Search
USPC .. 156/345.41, 345.48, 345.49; 118/723 MW, 723 AN, 723 I, 723 IR
See application file for complete search history.

(56) References Cited

U.S. PATENT DOCUMENTS

| | | | |
|---|---|---|---|
| 5,024,716 A | 6/1991 | Sato | |
| 6,325,018 B1 | 12/2001 | Hongoh | |
| 6,545,420 B1 | 4/2003 | Collins et al. | |
| 7,210,424 B2 | 5/2007 | Tolmachev et al. | |
| 7,819,082 B2 | 10/2010 | Ohmi et al. | |
| 7,842,159 B2 | 11/2010 | Yeom et al. | |
| 7,938,081 B2 | 5/2011 | Chen et al. | |
| 2001/0050059 A1* | 12/2001 | Hongo | H01J 37/32192 118/723 MW |
| 2002/0050486 A1* | 5/2002 | Ishii | H01J 37/32192 219/121.43 |
| 2002/0123200 A1* | 9/2002 | Yamamoto | H01J 37/32211 438/345 |
| 2004/0238490 A1 | 12/2004 | Sumiya et al. | |
| 2004/0261720 A1* | 12/2004 | Tolmachev | H01J 37/32211 118/723 MW |
| 2005/0022839 A1 | 2/2005 | Savas et al. | |

(Continued)

FOREIGN PATENT DOCUMENTS

| | | |
|---|---|---|
| EP | 2 267 841 A1 | 12/2010 |
| WO | WO2012/066779 | 5/2012 |

OTHER PUBLICATIONS

Notification of Transmittal (PCT/ISA/220), International Search Report (PCT/ISA/210) and Written Opinion (PCT/ISA/237) mailed Sep. 22, 2015 in PCT/US2015/032812 (13 pages).

*Primary Examiner* — Rakesh Dhingra

(74) *Attorney, Agent, or Firm* — Rothwell, Figg, Ernst & Manbeck, P.C.

(57) ABSTRACT

This disclosure relates to a plasma processing system that can use a single power source assembly to generate inductively coupled plasma (ICP) and surface wave plasma using the same physical hardware. The power source assembly may include an antenna plate that may include a conductive material be used an ICP coil for a radio frequency (RF) power source and as a slot antenna for a microwave source.

10 Claims, 5 Drawing Sheets

(56) References Cited

U.S. PATENT DOCUMENTS

| | | | |
|---|---|---|---|
| 2006/0065367 A1 | 3/2006 | Chen et al. | |
| 2006/0118241 A1* | 6/2006 | Ohmi | H01J 37/32192 156/345.41 |
| 2006/0150914 A1 | 7/2006 | Yamamoto et al. | |
| 2006/0251828 A1* | 11/2006 | Kobayashi | C23C 16/511 427/569 |
| 2007/0235425 A1* | 10/2007 | Oka | H01J 37/32192 219/121.43 |
| 2009/0194236 A1* | 8/2009 | Ono | H01J 37/32192 156/345.41 |
| 2009/0238998 A1 | 9/2009 | Stowell et al. | |
| 2010/0101728 A1 | 4/2010 | Iwasaki | |
| 2011/0018651 A1* | 1/2011 | Ikeda | H01J 37/32192 333/118 |
| 2013/0256272 A1 | 10/2013 | Zhao et al. | |
| 2013/0270997 A1 | 10/2013 | Zhao et al. | |

* cited by examiner

INTEGRATED INDUCTION COIL AND MICROWAVE ANTENNA AS AN ALL-PLANAR SOURCE

FIELD OF THE DISCLOSURE

This invention relates to semiconductor processing technology, and more particularly, to apparatus and methods for controlling plasma properties of a processing system for treating a semiconductor substrate.

BACKGROUND

Plasma uniformity, ion to radical flux ratio and energy flux control during plasma processing for treating semiconductor substrates are important to achieve patterning structures on a substrate or controlling the amount of material removed from or deposited on or into the substrate. Common methods for plasma generation are inductive coupling from an induction coil driven at radiofrequency power or the application of microwaves. Each method has distinct merits. Inductively coupled plasma sources (ICP) may be used to generate plasma at relatively low pressure high electron density and high electron temperature in the body of the plasma. In contrast, microwave sources tend to be operated at higher pressure. Operating in the over dense plasma regime or surface wave mode tend to generate relatively lower electron temperatures ($T_e$) in the plasma volume and near the substrate while also providing a large ion flux to the wafer. An example of this type of surface wave microwave plasma source is the radial line slotted antenna plasma source.

With surface wave driven microwave sources, it is difficult to control the plasma uniformity at low power and low pressure, regimes where ICP sources are typically operated. Furthermore, low electron temperature is not always desirable. Hard mask open (HMO) processes are those in which a silicon nitride or silicon dioxide mask is patterned with photoresist, then etched in a $CF_4$ or $CHF_3$ containing plasma so that the newly patterned silicon dioxide or silicon nitride may be a mask for the polysilicon gate patterning step that follows. HMO processes benefit from large fluorine fluxes (large fluorine to fluorocarbon ($CF_2$) ratio) from ample dissociation of precursors such as $CF_4$ in the case of oxide mask open. Among many considerations, excessive deposition on the photoresist must be avoided for mask critical dimension (CD) control. When the electron temperature is low and the chamber residence time long, while ample amounts of fluorine are generated by the microwaves, recombination of the fluorine with or among fluorocarbon radicals results in small fluorine to fluorocarbon radical ratios incident on the substrate. While the uniformity is excellent at high pressure, the plasma chemistry conditions are not optimal for this illustrative HMO process. Low pressure plasma chemistry conditions are desirable but good uniformity is difficult to achieve. For a gate stack etch step that follows the HMO step, microwave source operation at high pressure with resultant low Te conditions are desirable for profile control and selectivity. Large radical fluxes (e.g. Cl) that occur at high pressure result in radical coverage on the substrate that leads to highly chlorinated inert by-products (e.g. $SiCl_4$) as opposed to reactive by-products (e.g. SiCl) that redeposit on sidewalls leading to tapered polysilicon profiles. If the electron temperature is low, dissociation of the by-products into undesirable low degree of halogenation products is avoided. High pressure operation ensures that the ion energies are low enough to provide adequate selectivity when the gate is etched to the oxide beneath the polysilicon and selectivity to the hard mask.

ICP sources work well at low pressure and are characterized by high Te in the region that encompasses most of the plasma volume. As a result, conditions are desirable for HMO. The plasma uniformity is also typically acceptable. Unlike those for high pressure drive microwave discharges, gate etch processes with low pressure ICP operation require multiple process steps to avoid damage, recess in planar gate or physical damage to a fin structure, for example, in FinFET etch. The source of damage is related to the larger plasma potential near the wafer resulting from the relatively high electron temperature at low pressure.

Hence, it would desirable to combine the features of ICP and microwave sources in a way that enables processing of planar substrates.

SUMMARY OF THE DISCLOSURE

This disclosure relates to a plasma processing system for controlling plasma density (neutral radical and ion species and energy flux) over a substrate using a combination of inductively coupled plasma (ICP) and microwave sources. The plasma processing system may include a plasma chamber that can receive and process the substrate using plasma for etching, doping, or depositing a film on a semiconductor substrate.

The plasma chamber may include two or more plasma sources that can emit electromagnetic energy to ionize gas that is delivered via a gas delivery system. The two or more plasma sources may be arranged in a planar fashion and combined in a way that the energy transmission component is common for both plasma sources. For example, in a combined ICP and microwave plasma source, the transmission component is both an antenna for microwave plasma generation and an induction coil for ICP plasma generation. In one embodiment, a planar ICP coil and a planar microwave antenna applicator share the same physical hardware used to transmit microwave energy and RF energy into the plasma chamber into the plasma chamber.

In one embodiment, the plasma chamber may include a power source assembly that includes an antenna plate or transmission component that functions as a slot antenna for a microwave power supply and an ICP coil for a radio frequency (RF) power supply. The antenna plate may be disposed between a slow wave plate or microwave waveguide and a barrier component that isolates the microwave waveguide and antenna from the reactive gases provided to the plasma chamber. The slow wave plate also acts as a medium through which electromagnetic energy is coupled to the plasma. When the quarter wavelength of the electromagnetic waves is less than a minimum dimension in the plate, the electromagnetic wave may form a standing wave and couple to the plasma through the evanescent portion of the wave that passes from the plate to the plasma space. The barrier component may include, but is not limited to, a dielectric material that may be made of quartz or ceramic. The antenna plate may include a conductive material (e.g., metal) pattern across the surface and may be integrated with openings or slots through the antenna plate that may enable the transmission of microwave energy. In addition to transmitting microwave energy, the antenna plate may also transmit RF energy. The wavelength of the RF energy is greater than a thickness dimension of slow wave plate or the barrier component. The conductive material may be patterned in a way that forms a low impedance path for current across or around the plasma chamber. An RF power supply may be coupled to the antenna plate and may transmit an RF signal (e.g., current) through the conductive material to a ground terminal coupled to the conductive material. The RF signal may induce ionization (plasma) of the reactive gases by transmitting a magnetic field through the dielectric material. Accordingly, the antenna plate may be used to generate ICP plasma and surface wave plasma using a common transmission component for microwave energy and RF energy at the same time.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention. Additionally, the left most digit(s) of a reference number identifies the drawing in which the reference number first appears.

DETAILED DESCRIPTION

The following Detailed Description refers to accompanying drawings to illustrate exemplary embodiments consistent with the present disclosure. References in the Detailed Description to "one embodiment," "an embodiment," "an exemplary embodiment," etc., indicate that the exemplary embodiment described can include a particular feature, structure, or characteristic, but every exemplary embodiment does not necessarily include the particular feature, structure, or characteristic. Moreover, such phrases are not necessarily referring to the same embodiment. Further, when a particular feature, structure, or characteristic is described in connection with an embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other embodiments are possible, and modifications can be made to exemplary embodiments within the scope of the present disclosure. Therefore, the Detailed Description is not meant to limit the present disclosure. Rather, the scope of the present disclosure is defined only in accordance with the following claims and their equivalents.

The following Detailed Description of the exemplary embodiments will so fully reveal the general nature of the present disclosure that others can, by applying knowledge of those skilled in the relevant art(s), readily modify and/or adapt for various applications such exemplary embodiments, without undue experimentation, without departing from the scope of the present disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not limitation, such that the terminology or phraseology of the present specification is to be interpreted by those skilled in relevant art(s) in light of the teachings herein.

Figure 1:
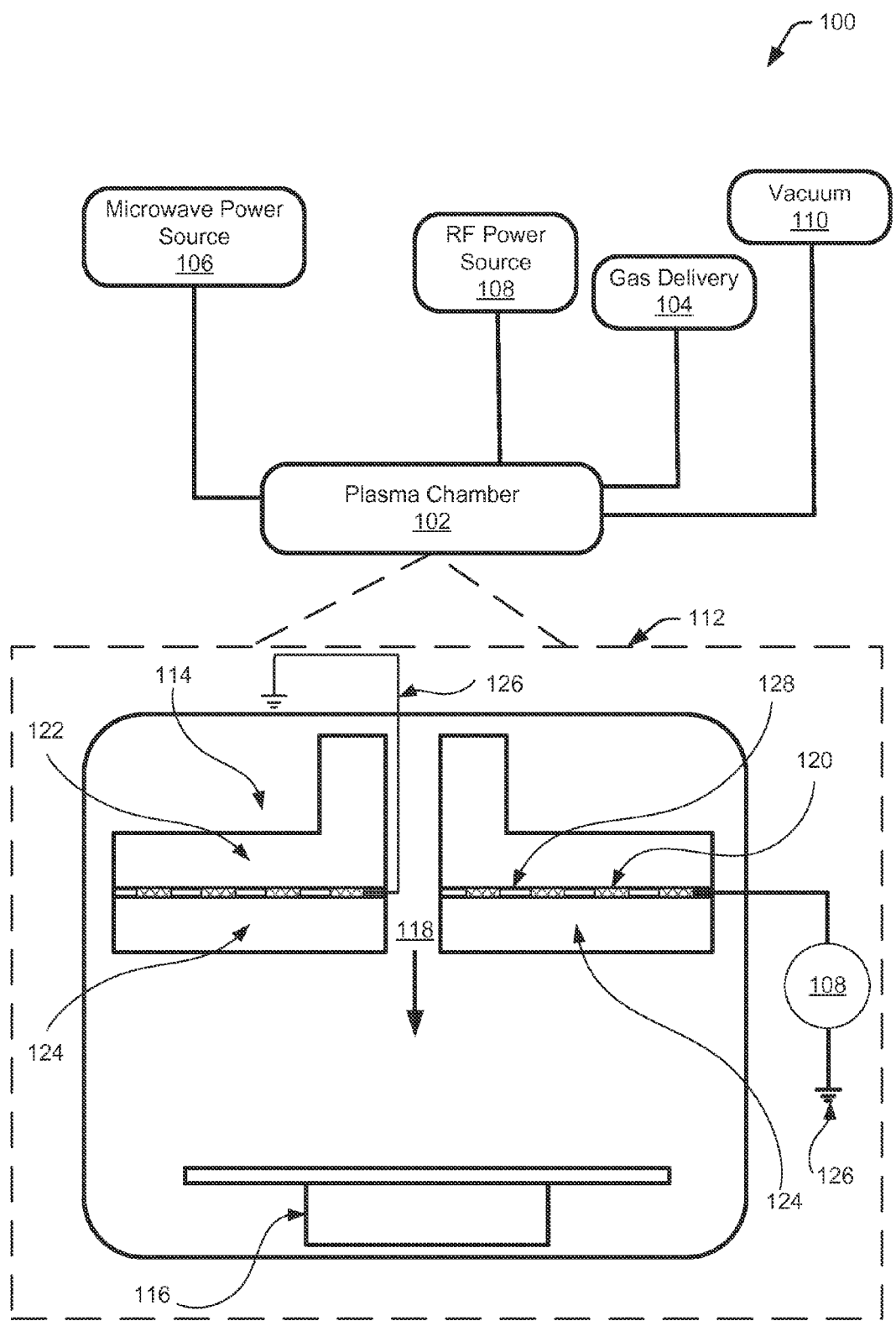
FIG. 1 is an illustration of a representative embodiment of a plasma processing system that shows a schematic cross-sectional illustration of a plasma chamber that includes a power source assembly that uses an antenna plate to transmit microwave and RF energy.

FIG. 1 depicts a plasma processing system 100 for treating substrates using plasma (not shown) that is generated in plasma chamber 102. Plasma may be generated in the plasma chamber 102 by ionizing gas that is provided by a gas delivery system 104 and exposing the gas to electromagnetic energy provided by a microwave power source 106 and a radio frequency (RF) power source 108. A vacuum system 110 may also maintain a sub-atmospheric pressure within the plasma chamber 102 during plasma generation. The gas delivery system 104 may include mass flow controllers, check valves, and the like to be used control the flow gas into the plasma chamber 102. The vacuum system 110 may include one or more pumps and control systems (e.g., $N_2$ ballast system, butter-fly valve system) to control the pressure within the plasma chamber 102.

Plasma generation may be done by applying electromagnetic energy to an electrically neutral gas to cause negatively charged electrons to be released from a gas molecule that is positively charged as result of the lost electron. Over time, the electromagnetic energy and the increasing electron collisions within the gas may increase the density of ionized molecules within the gas, such that the ionized molecules may be influenced by potential differences within the plasma chamber 102. For example, the potential differences within the plasma chamber 102 may direct the ionized molecules (or atoms, or radicals) towards a substrate (not shown). The ionized molecules may interact with the substrate or treat the substrate in a way that may remove a portion of the substrate or may be deposited unto the substrate. In this way, patterns may be etched into the substrate or films may be deposited onto the substrate.

The plasma chamber 102 cross section illustration 112 may depict one embodiment of a power source assembly 114 that enables the transmission of microwave energy, RF energy, and gas into the region proximate to the substrate holder 116. Gas may be introduced into the plasma processing region that is proximate to the substrate holder 116, along the gas pathway 118 through the center of the power source assembly 114. In other embodiments, gas may be introduced from other locations within the plasma chamber 102. The plasma processing region may also receive energy from the power source assembly 114 to generate plasma that may be used to treat a substrate (not shown) disposed on the substrate holder 116. The energy may include a combination of microwave energy and RF energy that are both transmitted, in some way, from an antenna plate 120 disposed between microwave waveguide 122 and a dielectric component 124 that is opposite the substrate holder 116. In this embodiment, the antenna plate 120, microwave waveguide 122, and the dielectric component 124 may be disposed around the gas pathway 118. Such that the aforementioned components illustrated on each side of the gas pathway 118 may be of the same or continuous arrangement of the components.

The antenna plate 120 may be arranged in a way that enables current to flow around the power source assembly 114 in a plane that may substantially parallel to the substrate holder 116. The current may be induced to flow between RF power source 108 and the ground terminal 126 along a low impedance path (e.g., metal layer) and generate a magnetic field (not shown) around the low impedance path. In this embodiment, the low impedance path may be circular and may be disposed around the gas pathway with a decreasing radius until the low impedance path ends proximate to the gas pathway 118. An electrical ground 126 connection may be made to the low impedance path proximate to the gas pathway 118 and the RF power supply 108 connection may be made to the low impedance path proximate to the outer edge of the power source assembly 114. The arrangement of the low impedance path will be described in greater detail in the description of FIGS. 3 and 4. The low impedance path may be formed by a conductive material that may be coupled to the microwave waveguide 122 or the dielectric component 124. The conductive material may include, but is not limited to, aluminum, steel, or copper. The conductive material may also be a film deposited on the surface of the microwave waveguide 122 and may have a thickness of at least 2 mm.

The area between portions of the low impedance path where current may not flow between certain portions of the low impedance path may be referred to a microwave gap 128. The microwave gap 128 may be an open area or gap or may be occupied by a dielectric material that prevents current from leaving the low impedance path. The microwave gap 128 may be continuous and follow a similar pattern as the low impedance path. The gap dimensions of the microwave gap 128 may vary between 5 microns, the skin depth of the metal and 10 mm and may be generally less than a quarter wavelength of the microwaves in the dielectric material, and may vary based, at least in part, on the type of standing wave generated in the microwave waveguide 122. The microwave gap 128 may be configured or oriented to enable the transmission of a standing wave (not shown) into the dielectric component 124. In this way, the standing wave may energize process gases in the plasma chamber 102 to generate plasma to treat the substrate.

In other embodiments, the microwave gap 128 may not be continuous and may be formed using a plurality of openings or slots within the antenna plate 120 around the low impedance path. In some instances, the openings or slots may intersect with the low impedance path, but in a manner that doesn't prevent current flow through the low impedance path.

As will be described in greater detail in FIG. 2, the standing wave (not shown) may be generated in the microwave waveguide 122 that enables the transmission of energy via the antenna plate 120. Concurrently, the magnetic field may also be transmitted from the antenna plate 120 due to a current flow (not shown) induced by an RF power source 108 coupled to the antenna plate 120.

Figure 2:
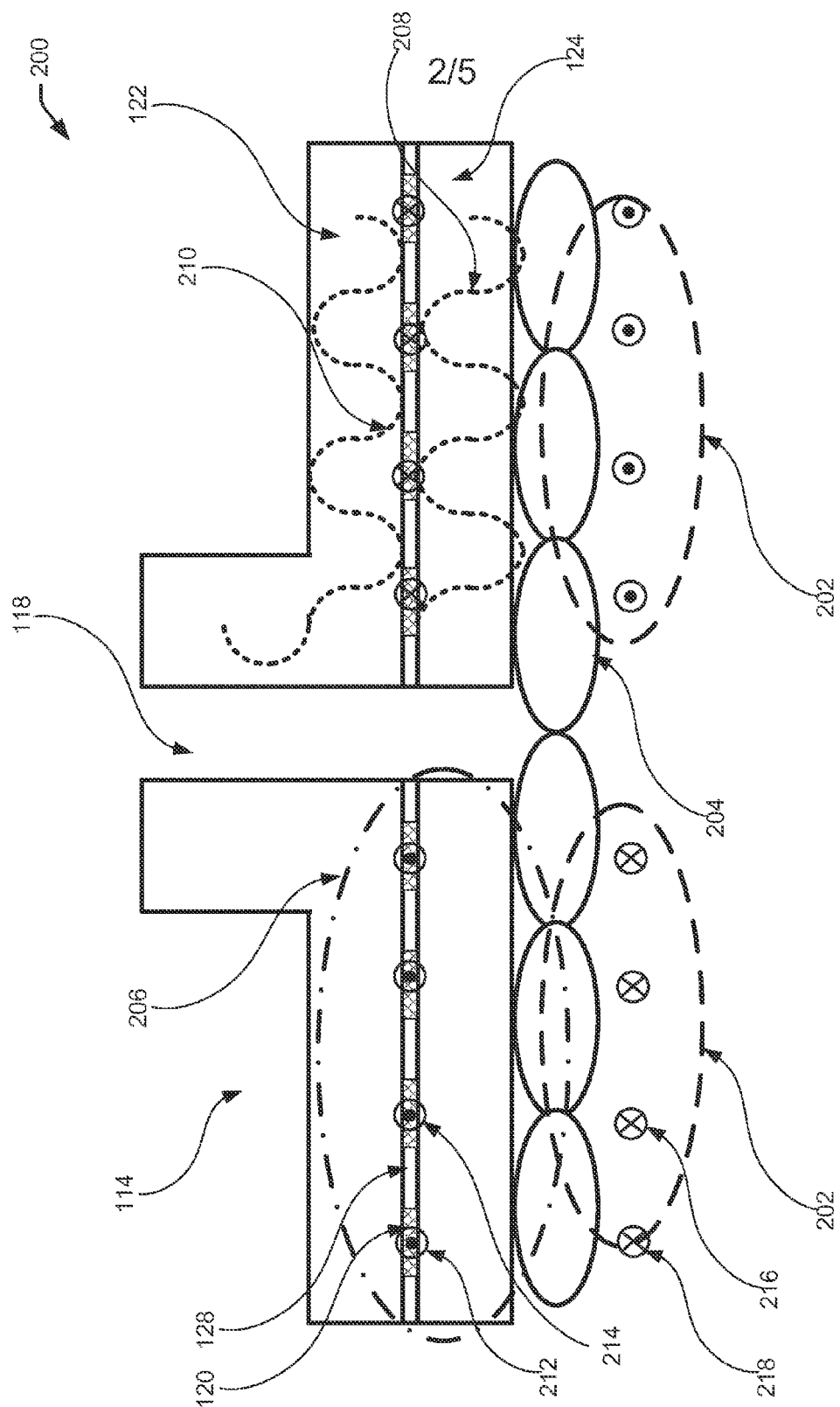
FIG. 2 is a schematic cross-sectional illustration of the power source assembly that uses an antenna plate to generate inductively coupled plasma and surface wave plasma inside the plasma chamber.

FIG. 2 is a schematic cross-sectional illustration 200 the power source assembly 114 that uses an antenna plate 120 to generate inductively coupled plasma (ICP) 202 and surface wave plasma (SWP) 204 inside the plasma chamber 102. Generally, ICP 202 may be generated by a magnetic field 206 that may be formed by the current flow through the low impedance path of the antenna plate 120. The SWP 204 may be generated when gas in the plasma chamber 102 are energized by a dielectric standing wave 208 that may be generated by the standing wave 210 in the microwave waveguide 122 provided by the microwave power source 106. Although the magnetic field 206, the dielectric standing wave 208, and the standing wave 210 are shown to be on opposite sides of the power source assembly 114, these features exist in both sides of the power source assembly 114 as evidence by the ICP 202 and SWP 204 across both portions of the power source assembly 114. The features are illustrated separately for the purpose of ease of explanation and illustration, such that the electric and magnetic field patterns where the right and left views represent fields of cylindrical symmetry.

Turning to the ICP 202 portion of the illustration 200, in this embodiment, the antenna plate 120 may form a low impedance path around the power source assembly 114 that may carry current in a circular manner from the outside edge towards the center of the power source assembly 114. In this instance, the circular current flow may be represented by outward direction 212 and the inward direction of the current from the surface of the illustration 200. The outward direction 212 indicates that the current may flowing along the surface of the conductive material that forms the low impedance path in a direction that extends out substantially normal from the plane formed by the page of FIG. 2. The inward direction 214 indicates that the current may flowing along the surface of the conductive material that forms the low impedance path in a direction that extends into the plane formed by the page of FIG. 2 in a substantially normal manner. A magnetic field 206 may form around the low impedance path as a result of the current flow. Although portions of the path may generate a distinct portion of the magnetic field 206, for the purpose of ease of illustration, the magnetic field 206 is shown in a monolithic representation that encompasses all portions of the low impedance path.

The RF magnetic field 206 may be used to energize electrons (not shown) in the plasma chamber 102 by inducing current flow within the ICP 202 plasma that is substantially parallel to the current flow in the antenna plate 120. The induced current flow is illustrated by the outward 216 and inward 218 current flows in the ICP 202. The current flow may be rotating around the gas pathway 118 using the ICP 202 as shown by the current flowing outward 216 and the current flowing inward 218 into the figure. However, in other embodiments, the ICP 202 may be configured to direct current inward or outward in an alternating manner, such that the right most portion of the ICP 202 may have current going inward and the immediately adjacent portion of the ICP 202 may have current flowing out from the figure. The inward and outward directions of current may alternate along the remaining portions of the ICP 202. ICP circular currents 212 and 214 may be out of phase with one another. Naturally, the induced current (e.g., current 216 or 218) may be out of phase with one another and may be flowing in the opposite direction of their respective circular currents 212 and 214.

Turning to the SWP 204 portion of the illustration 200, the dielectric standing wave 208 may be generated from the standing wave 210 that is formed in the microwave waveguide 122. At least a portion of the dielectric standing wave 208 may be transmitted into a portion of the plasma chamber 102 (e.g., outside of the dielectric component 124) that is opposite the substrate holder 116 to energize gas (not shown) to form the SWP 204. The combination of the ICP 202 and SWP 204 may be used to treat the substrate that is placed in/on the substrate holder 116. The plasma density and uniformity may be related to the design of the antenna plate 120, the applied microwave power, the applied RF power, and the type of gases in the plasma chamber 102.

In one embodiment, the microwave power may range between 500 W to 5000 W and the bias power may range between 300 W to 500 W and may operate at a relatively low pressure (e.g., <100 mTorr) and use a $CHF_3$ chemistry. In another embodiment, the process pressure may be relatively higher (e.g., >100 mTorr) and use a $Ar/Cl_2$ or Ar/HBr chemistry and use a microwave power between 200 W to 2000 W.

Figure 3:
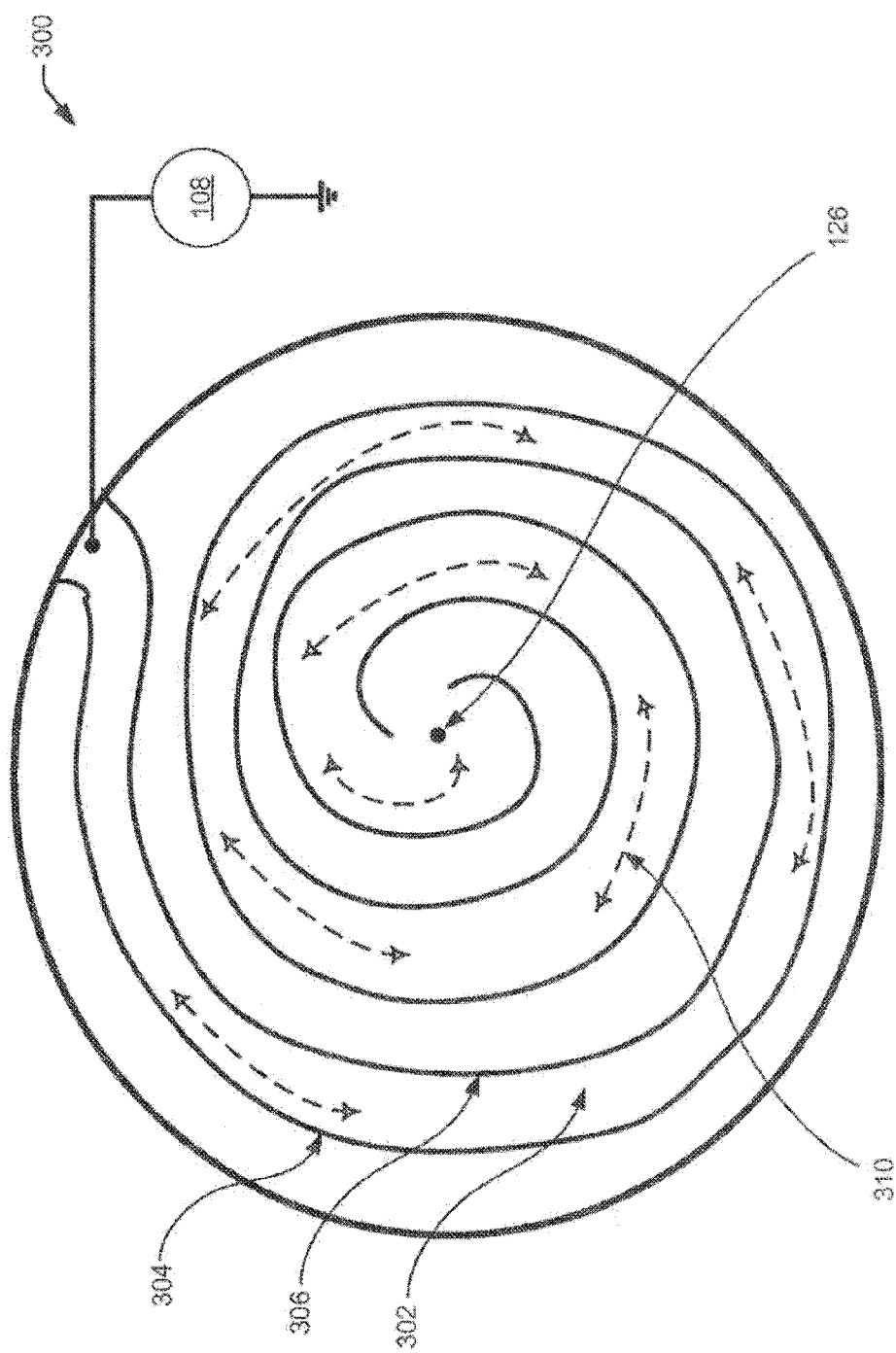
FIG. 3 is an illustration of a representative embodiment of an antenna plate pattern incorporating conductive material and openings/slots that may be used to transmit energy that generates plasma in the plasma chamber.

FIG. 3 is a top view illustration 300 of a representative embodiment of an antenna plate 120 pattern that may be an ICP coil and a slot antenna for the plasma chamber 102. The antenna plate 120 may include a low impedance path 302 to carry current as part of operating like an ICP coil used to generate ICP plasma 202. The antenna plate 120 may also operate as a slot antenna to generate SWP 204 by having a first slot opening 304 and a second slot opening 306 that may form the contours of the low impedance path 302 around the antenna plate 120. The first slot opening 304 and the second slot opening 306 may enable microwave energy transmitted along the antenna plate 120 to be transmitted through the opening into the plasma chamber 102 that is opposite the antenna plate 120, as shown in FIG. 1.

The openings may include a thickness that enables the transmission of energy into the plasma chamber 102. The opening thickness or distance may vary depending on the wavelength of the energy provided by the power source 108. In one embodiment, the distance may comprise a distance that does not exceed ½ wavelength of the energy provided by the power source 108.

In another embodiment, the openings may be non-continuous in contrast to the openings 304, 306 shown in FIG. 3. For example, the openings may be comprised of discrete openings arranged in a pattern around the antenna plate 120. The distance between the openings may be arranged to direct the current flow 310 in a desired direction around the antenna plate 120 or the gas pathway 118.

The openings may comprise a rectangular, square, triangular, or oblong shape and may be filled with a gas (e.g., Ar, $N_2$, He, etc.) or a dielectric material (e.g., quartz, ceramic, etc.). A rectangle may include a four sided object in which two of the four sides are longer than the two other sides. A square may include a four sided object with substantially similar lengths. A triangular shape may include a three sided object that may include sides of equal length or at least two sides that are shorter than the longest side. An oblong object may be similar to rectangle with sides that are rounded such that the angle between the sides is less than ninety degrees or may be more circular in shape than the rectangle or square.

The low impedance path 302 may be made of metal (e.g., copper) or any other conductive material that may enable current flow between the RF power supply 108 and the ground terminal 126 that may be coupled to the low impedance path 302. The current flow 310 may oscillate along the low impedance path 302 as illustrated by the arrows.

The pattern of the low impedance path 302 and the openings 304, 306 may vary in size and orientation is should not be limited to the circular pattern shown in FIG. 3. In other embodiments, the low impedance path 302 may be square or rectangular in shape and in such a way that distributes the current across the antenna plate 120 in any manner. The low impedance path 302 may vary in width between 1 mm and 5 cm between thickness of 5 microns and 10 mm in thickness. The width should not exceed ½ the microwave wavelength which is 3 cm for 2.45 GHz.

The pattern may also account for the location of the ground terminal 126 and the RF power supply 108, in that their locations may be optimized to extend the path of the current the across the surface area of the power source assembly 114. In the FIG. 3 embodiment, the ground 126 may disposed proximate to the center of the antenna plate 120 and the power supply near the edge of the antenna plate 120. In this instance, the current may flow or oscillate along the low impedance path 302 between the power source 108 and the ground 126. In this way, energy may be transmitted through the openings 304, 306 into the processing region of the plasma chamber 102 or via the magnetic fields 206 that induce current flow in the process gas in the processing region.

In another embodiment, the antenna plate 120 may be coupled to one or more power sources at the edge of the antenna plate 120. The openings 304, 306 may be arranged to drive current around the antenna plate 120, such that adjacent portions of the low impedance path 302 that may be separated by an opening may have current that is out of phase with the adjacent portion. One example of this type of embodiment is shown in FIG. 4.

In one specific embodiment, using a surface wave source with a frequency of 2.45 GHz, the opening width may be more than more than 5 cm. However, in another embodiment using RF-ICP source the opening width may be more than 1 mm.

In another embodiment, the antenna plate 120 may have one or more power sources at the center of the antenna plate. In one instance, the openings 304, 306 may be arranged to drive current around the antenna plate 120 towards a ground located at the edge of the antenna plate 120. In this embodiment, adjacent portions of the low impedance path 302 that may be separated by an opening may have current that is out of phase with the adjacent portion of the antenna plate. In another embodiment, the ground may also be located near the center of the antenna plate 120, proximate to the power source. The openings may be arranged to drive the current around the antenna plate 120 and back to the ground near the center of the antenna plate 120.

Figure 4:
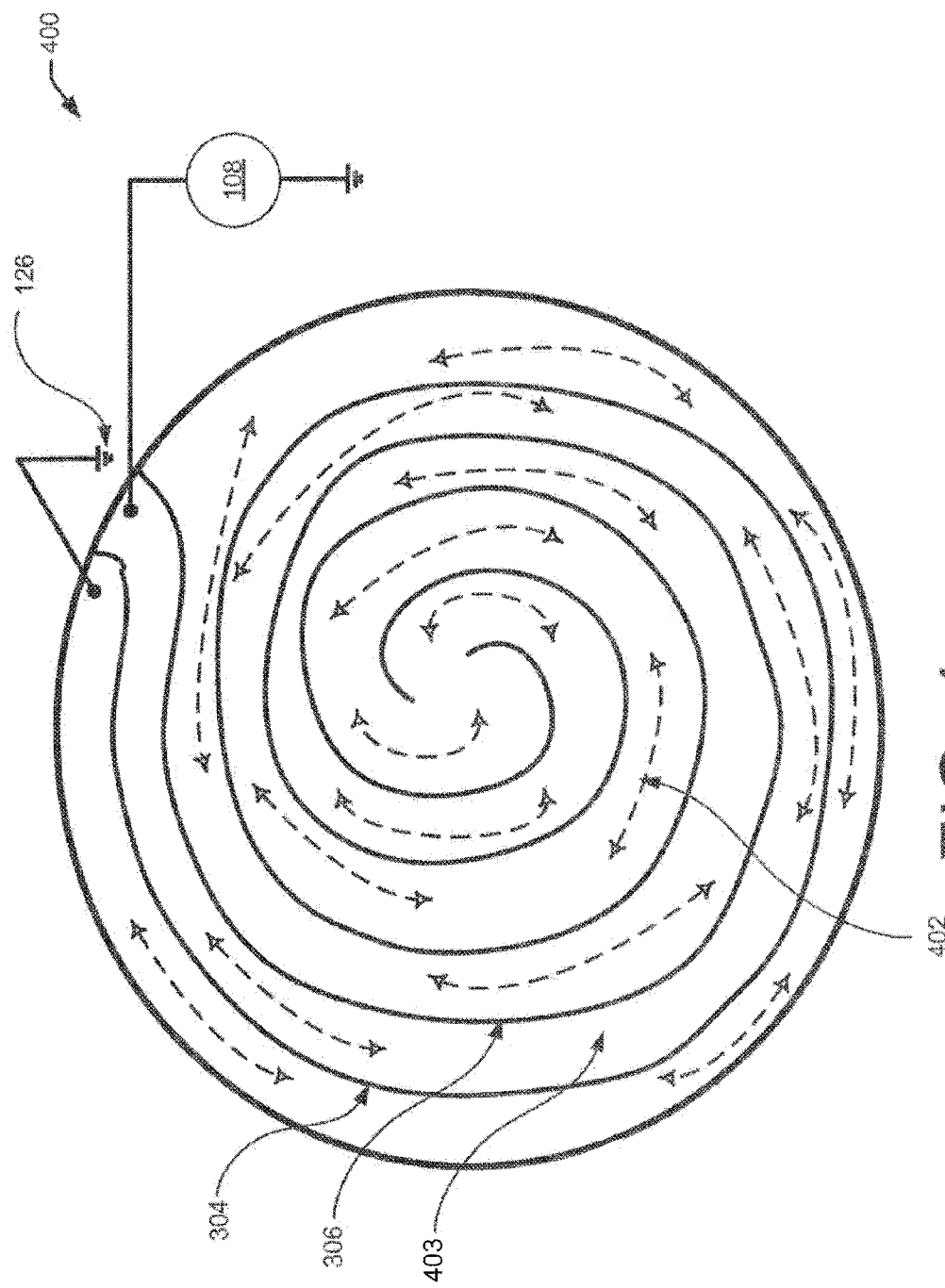
FIG. 4 is an illustration of another representative embodiment of an antenna plate pattern that may be an ICP coil and a slot antenna for the plasma chamber.

FIG. 4 is an illustration 400 of another representative embodiment of an antenna plate 120 pattern that may be used as an ICP coil and a slot antenna for the plasma chamber 102. The conductive path 403 (e.g., similar to the low impedance path 302) may also carry or oscillate current between the RF power supply 108 and the ground terminal 126. In this embodiment, the conductive path 402 may be arranged to locate the RF power supply 108 connection and the ground terminal connection 126 proximate to the edge of the power source assembly 114. The placement of the ground 126 may alter the current path or oscillation in a way that may enable current flow between adjacent portions of the low impedance path 302 to be out of phase with each other, such that the current flow may be in opposite directions between the adjacent portions. In this instance, the low impedance path 302 may start at the power source 108 connection and follow a substantially circular path towards the center of the antenna plate 120. In contrast to FIG. 3, the ground 126 is located at the edge of the antenna plate 120 and the openings 304, 306 may direct the current back towards the edge in a substantially circular path.

In other embodiments, the openings 304, 306 may be arranged in any other pattern to direct energy into the processing region of the plasma chamber 102. For example, the openings may be arranged in a substantially linear path across the antenna plate 120 and may extend back and forth several times across the antenna plate 120.

Figure 5:
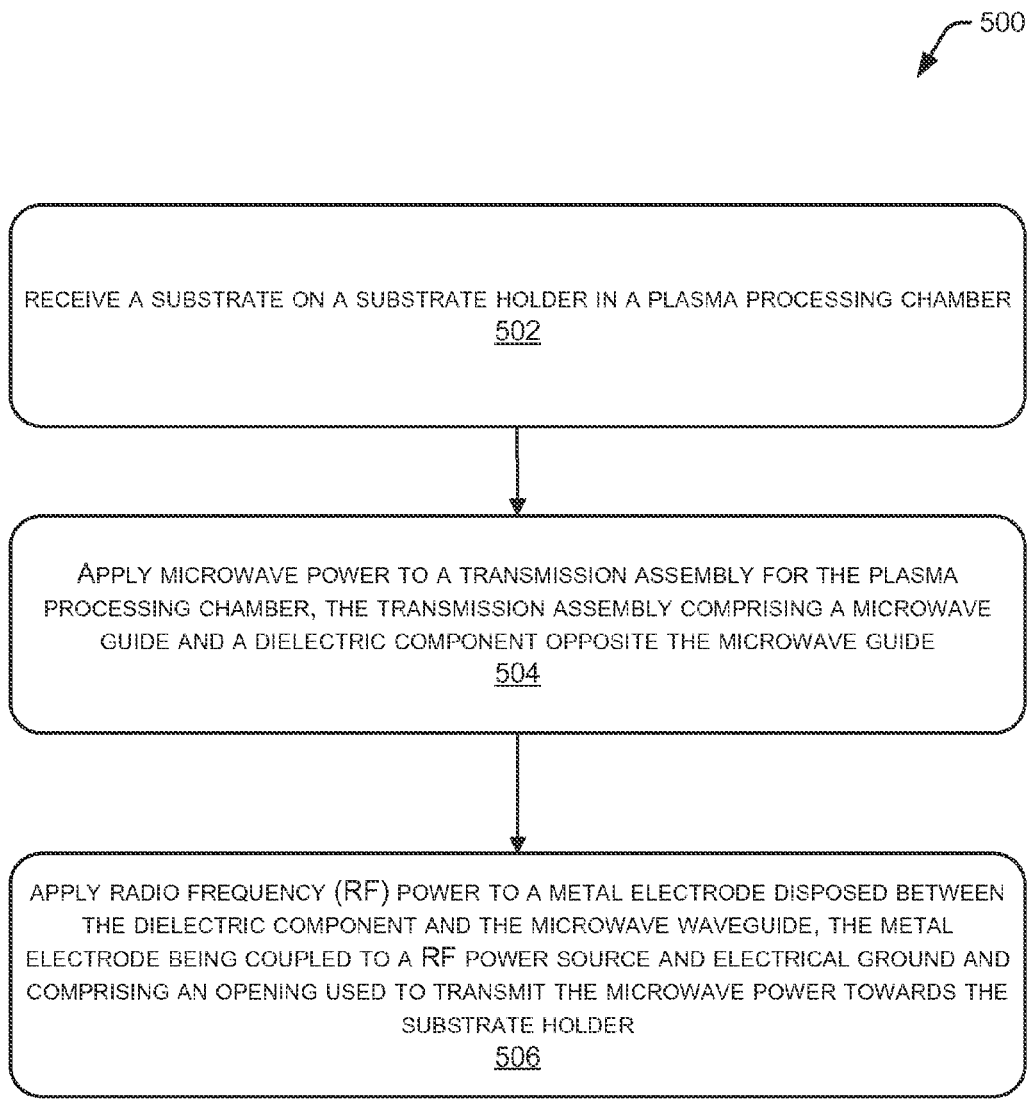
FIG. 5 is a flow diagram for a method for generating plasma in the plasma chamber using the antenna plate.

FIG. 5 is a flow diagram 500 for a method for generating plasma in the plasma chamber 102 using the antenna plate 120 as a RF source and a microwave source to generate ICP 202 and SWP 204. The antenna plate 120, as shown in FIG. 1, may be opposite the substrate holder 116 in the plasma chamber 102. The processing may be for semiconductor substrates used to build integrated circuits or microelectronic devices used in computers, mobile phones, and the like.

At block 502, the substrate holder 116 may receive a semiconductor substrate to be treated in the plasma chamber 102. The semiconductor substrate may comprise, but is not limited to, silicon germanium, gallium arsenide, indium, or the like and may include conductor or insulator characteristics dependent on the type and concentration of materials in the semiconductor substrate. The semiconductor substrate may also include films deposited on a surface that may be used to form transistors, diodes, or integrated circuit devices. The plasma processing chamber 102 may be used form the aforementioned components.

The plasma processing chamber 102 may also receive gas from the gas delivery system 104, the gas being used to generate plasma when energy is applied under sub-atmospheric conditions controlled by the vacuum system 110. The energy may be applied by power source assembly 114 using one or more techniques described below.

At block 504, the power source assembly 114 or the transmission assembly may receive microwave power from the microwave power source 106. The transmission assembly may include a microwave waveguide 122, a dielectric component 124, and an antenna plate 120 disposed between the microwave waveguide 122 and the dielectric component 124. The antenna plate 120 may include openings 304 (e.g., microwave gap 128) or slots that may be used transmit microwave energy through the antenna plate 120 to the dielectric component 124. The opening(s) or slot(s) may be adjacent to or in a metal electrode 302 that may contain a portion of the standing wave 210 in the microwave waveguide 122. When the microwave power is applied to microwave waveguide 122, the energy may be used to energize the gas disposed within the plasma processing chamber 102. However, the microwave plasma (e.g., SWP 204) may not be the only plasma generated by the power source assembly 114. The antenna plate 120 may also be used as an ICP coil to generate ICP 202 plasma at the same or substantially the same time.

At block 506, RF power may be applied to the antenna plate 120 to flow current from the RF power supply 108 to the electrical ground terminal 126. As illustrated in FIG. 2, the ICP 202 plasma may be generated by the magnetic fields induced by the flowing or oscillating current 306 through the antenna plate 120 (e.g., conductive path 402). In one embodiment, the RF power and the microwave power may be applied concurrently to the antenna plate 120 during substrate treatment.

In on embodiment, the conductive path 402 may form a substantially concentric or rectangular shape along the microwave waveguide 122 and be located between the RF power supply 108 terminal proximate to a first end of the conductive path 402 and an electrical ground terminal 126 proximate to a second end of the conductive path 402.

It is to be appreciated that the Detailed Description section, and not the Abstract section, is intended to be used to interpret the claims. The Abstract section can set forth one or more, but not all exemplary embodiments, of the present disclosure, and thus, is not intended to limit the present disclosure and the appended claims in any way.

While the present disclosure has been illustrated by the description of one or more embodiments thereof, and while the embodiments have been described in considerable detail, they are not intended to restrict or in any way limit the scope of the appended claims to such detail. Additional advantages and modifications will readily appear to those skilled in art. The invention in its broader aspects is therefore not limited to the specific details, representative apparatus and method and illustrative examples shown and described. Accordingly, departures may be made from such details without departing from the scope of the general inventive concept.

What is claimed is:

1. A plasma processing device for a substrate, comprising:
a plasma processing chamber;
a substrate holder disposed in the plasma processing chamber and configured to receive the substrate;
a microwave power supply configured to generate microwave energy;
a radio frequency (RF) power supply configured to generate RF energy; and
a slot antenna comprising:
(i) a first dielectric component formed in a first slot opening of the slot antenna, the first dielectric component coupled to the microwave power supply and configured to transmit the microwave energy,
(ii) a second dielectric component formed in a second slot opening of the slot antenna, and
(iii) a metal layer disposed between the first dielectric component and the second dielectric component and wherein the metal layer is coupled to the radio frequency power supply so that the radio frequency power supply supplies radio frequency power to the metal layer;
wherein the metal layer comprises a pattern that enables the transmission of the microwave energy from the first dielectric component to the second dielectric component, and
wherein the pattern comprises a continuous low impedance path starting proximate to the edge of the slot antenna and ending proximate to a center region of the slot antenna and the first slot and the second slot form contours along the low impedance path starting proximate to the edge of the slot antenna and ending proximate to a center region of the slot antenna.

2. The device of claim 1, wherein the continuous path comprises a spiral.

3. The device of claim 2, further comprising a ground proximate to the center of the slot antenna or at an outer edge of the slot antenna.

4. The device of claim 3, wherein the first dielectric component comprises quartz or ceramic comprising a thickness that is proportional to no more than a ¼ wavelength of the power provided by the microwave power supply.

5. The device of claim 1, where in the metal layer comprises a thickness less than or equal to 1 mm.

6. The device of claim 5, wherein the second dielectric component comprises quartz or ceramic comprising a thickness ranging from ¼ to ½ wavelength of the power provided by the microwave power supply.

7. The device of claim 1, wherein the metal layer is configured to transmit the RF energy in an azimuthal direction and the second dielectric component is configured to transmit the microwave energy and the RF energy.

8. The device of claim 1, wherein the metal layer pattern comprises a spiral shape starting proximate to an edge of the slot antenna and ending proximate to a center region of the slot antenna.

9. The device of claim 1, wherein the metal layer comprises a metal layer pattern on a surface of the first dielectric component and the second dielectric component.

10. A slot antenna for generating plasma for treating a semiconductor substrate, comprising:
- a first dielectric component formed in a first slot opening of the slot antenna, the first dielectric component coupled to a microwave power supply and configured to transmit microwave energy to generate the plasma for treating the semiconductor substrate;
- a second dielectric component formed in a second slot opening of the slot antenna, the second dielectric component opposite from the first dielectric component; and
- a metal layer on a surface of the first dielectric component or the second dielectric component, the metal layer coupled to a radio frequency power supply,
- wherein the metal layer comprises a pattern that enables the transmission of the microwave energy from the first dielectric component to the second dielectric component, and
- wherein the pattern comprises a continuous low impedance path starting proximate to the edge of the slot antenna and ending proximate to a center region of the slot antenna and the first slot and the second slot form contours along the low impedance path starting proximate to the edge of the slot antenna and ending proximate to a center region of the slot antenna.

* * * * *